United States Patent
Hu et al.

(10) Patent No.: US 8,255,768 B2
(45) Date of Patent: Aug. 28, 2012

(54) INTERLACED ITERATIVE SYSTEM DESIGN FOR 1K-BYTE BLOCK WITH 512-BYTE LDPC CODEWORDS

(75) Inventors: Xinde Hu, San Diego, CA (US); Sivagnanam Parthasarathy, Carlsbad, CA (US); Shayan Srinivasa Garani, San Diego, CA (US); Anthony Weathers, San Diego, CA (US); Richard Barndt, San Diego, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 472 days.

(21) Appl. No.: 12/610,094

(22) Filed: Oct. 30, 2009

(65) Prior Publication Data

US 2011/0078540 A1    Mar. 31, 2011

Related U.S. Application Data

(60) Provisional application No. 61/245,956, filed on Sep. 25, 2009.

(51) Int. Cl.
*G06F 11/00* (2006.01)

(52) U.S. Cl. ........................................ 714/758

(58) Field of Classification Search .................. 714/758, 714/764
See application file for complete search history.

(56) References Cited

U.S. PATENT DOCUMENTS

| | | | |
|---|---|---|---|
| 8,006,172 B2 * | 8/2011 | Boyer et al. ................... | 714/786 |
| 8,151,160 B1 * | 4/2012 | Andreev et al. ............... | 714/752 |
| 2006/0274687 A1 * | 12/2006 | Kim .............................. | 370/328 |
| 2010/0251069 A1 * | 9/2010 | Sun et al. ...................... | 714/758 |
| 2011/0176405 A1 * | 7/2011 | Nimbalker et al. ........... | 370/206 |

* cited by examiner

*Primary Examiner* — Marc Duncan

(57) ABSTRACT

To allow a single LDPC decoder to operate on both 512 B blocks and 4 KB blocks with comparable error correction performance, 512 KB blocks are interlaced to form a 1 KB data sequence, and four sequential 1 KB data sequences are concatenated to form a 4 KB sector. A de-interlacer between the detector and decoder forms multiple data sequence from a single data sequence output by the detector. The multiple data sequences are separately processed by a de-interleaver between the de-interlacer and the LDPC decoder, by the LDPC decoder, and by an interleaver at the output of the LDPD decoder. An interlacer recombines the multiple data sequences into a single output. Diversity may be improved by feeding interleaver seeds for respective codewords into the de-interleaver and interleaver during processing.

20 Claims, 2 Drawing Sheets

INTERLACED ITERATIVE SYSTEM DESIGN FOR 1K-BYTE BLOCK WITH 512-BYTE LDPC CODEWORDS

CROSS-REFERENCE TO RELATED APPLICATION(S) AND CLAIM OF PRIORITY

The present application is related to U.S. Provisional Patent Application No. 61/245,956, filed Sep. 25, 2009, entitled "INTERLACED ITERATIVE SYSTEM DESIGN FOR 1 K-BYTE BLOCK WITH 512-BYTE LDPC CODEWORDS." Provisional Patent Application No. 61/245,956 is assigned to the assignee of the present application and is hereby incorporated by reference into the present application as if fully set forth herein. The present application hereby claims priority under 35 U.S.C. §119(e) to U.S. Provisional Patent Application No. 61/245,956.

TECHNICAL FIELD

The present disclosure is directed, in general, to parity check codes, and more specifically to implementing parity check codes adapted for efficient implementation of a decoder that may operate on any of multiple different data block sizes.

BACKGROUND

Low-density parity-check (LDPC) codes are finding application in error correction for hard disk drives due to their simplicity and effectiveness. Due to the specific requirements of hard disk drive applications, an LDPC coded iterative system needs to be compatible with both size-512 byte (B) sector based systems and size-4 kilobyte (KB) sector based systems.

To optimize or at least reduce the system complexity, these two systems have to share a majority part of the system logic, while maintaining good error correcting performance for both sector sizes. Compared with conventional size-512 B sector only system, a size-4 KB sector based system is expected to have better error correcting performance because of the potential codeword length and the presence of longer interleavers. Thus, special system designs are needed to minimize the overall system complexity and improve the error correcting performance.

There is, therefore, a need in the art for improved implementation of low-density parity-check coding.

SUMMARY

To allow a single LDPC decoder to operate on both 512 B blocks and 4 KB blocks with comparable error correction performance, 512 KB blocks are interlaced to form a 1 KB data sequence, and four sequential 1 KB data sequences are concatenated to form a 4 KB sector. A de-interlacer between the detector and decoder forms multiple data sequence from a single data sequence output by the detector. The multiple data sequences are separately processed by a de-interleaver between the de-interlacer and the LDPC decoder, by the LDPC decoder, and by an interleaver at the output of the LDPD decoder. An interlacer recombines the multiple data sequences into a single output. Diversity may be improved by feeding interleaver seeds for respective codewords into the de-interleaver and interleaver during processing.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part S thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
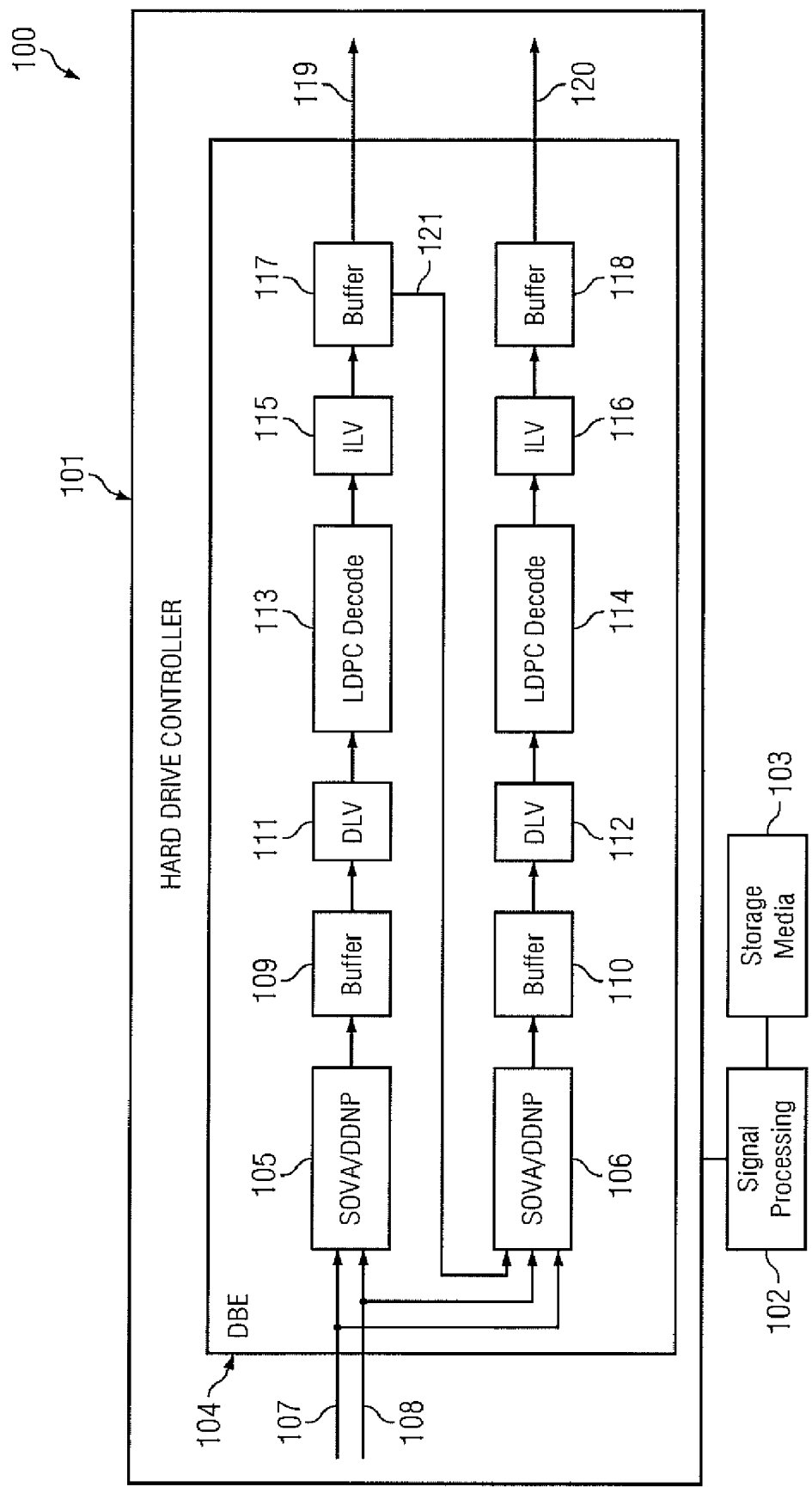
FIG. 1 is a simplified diagram of the digital back end within a hard disk drive controller including an LDPC coded iterative system based on size-512 B sectors, only, according to one embodiment of the present disclosure.
Figure 2:
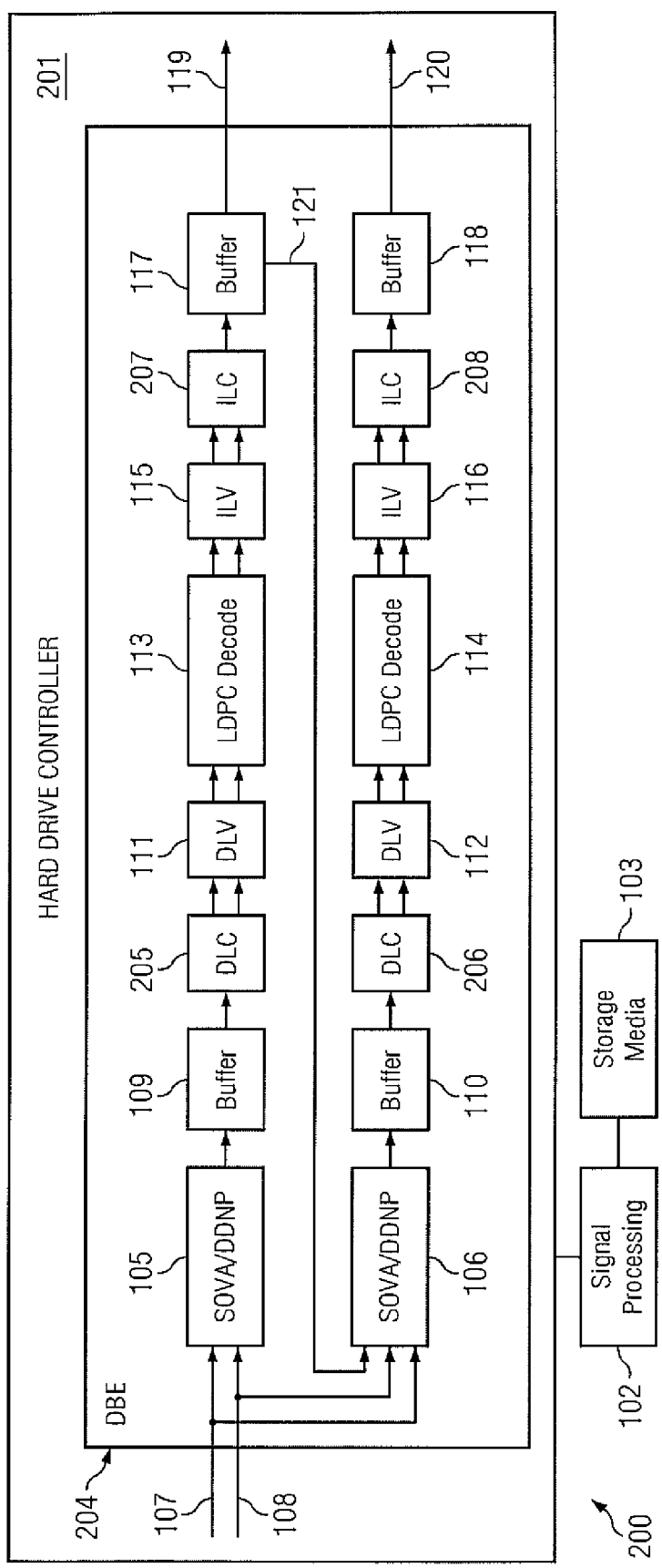
FIG. 2 is a simplified diagram of the digital back end within a hard disk drive controller including an LDPC coded iterative system based on both size-512 B and size-4 KB sectors according to one embodiment of the present disclosure.
Figure 3:
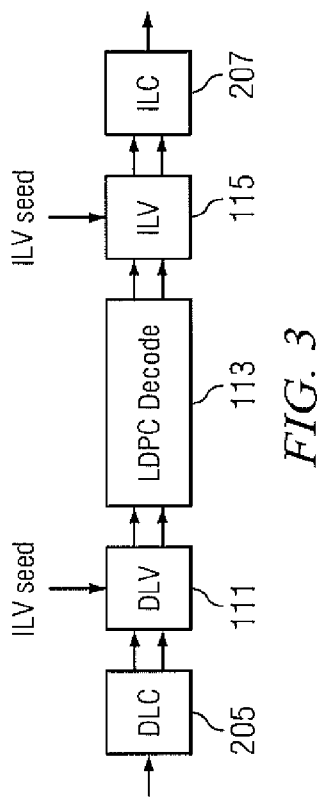
FIG. 3 illustrates a technique for employing different interleavers in the digital back end of FIG. 2 according to one embodiment of the present disclosure.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

FIG. 1 is a simplified diagram of the digital back end (DBE) within a hard disk drive controller including an LDPC coded iterative system based on size-512 B sectors, only, according to one embodiment of the present disclosure. The hard disk drive controller 101 is part of a hard drive 100, such as a magnetic disk drive. As such, hard drive controller 101 is coupled by signal processing electronics 102 to storage media 103. The storage media 103 includes, for example, magnetic disks, pick-up heads, servos and the like configured as known in the art to enable digital data to be written to and read from the hard drive 100. Signal processing electronics 102 typically includes one or more amplifiers, filters, equalization units, and related circuitry allowing signals corresponding to data read from the hard drive 100 to be processed into usable digital form, in accordance with the known art.

Controller 101 is preferably an integrated circuit or set of integrated circuits operating under firmware or software programming. Those skilled in the art will recognize the that full structure and operation of hard drive controller 101, and of the hard drive 100 including controller 101, is not depicted in the figures or described herein. Instead, for simplicity and clarity, on so much of the known structure and operation of a hard drive and hard drive controller as is unique to the present disclosure and/or necessary for an understanding of the discussion herein is depicted and described.

The digital back end (DBE) portion 104 of hard drive controller 101 includes two sets of detector-decoder combinations. Each detector-decoder combination employs a soft output Viterbi algorithm (SOVA) with data-dependent noise-prediction (DDNP) detector 105, 106. Each SOVA/DDNP detector 105, 106 is coupled to a pair of signal inputs 107, 108 receiving, respectively, equalized samples of the data read from the storage media 103 and DBE configuration data. The output of each SOVA/DDNP detector 105, 106 is buffered with a detector output buffer 109, 110 and supplied to a de-interleaver (DLV) 111, 112.

Commonly employed to overcome correlated noise, interleaving involves rearranging a sequence of data such that consecutive data (e.g., sequential bytes or bits) are split among different data blocks within the output sequence to render such correlated noise statistically independent and thus allow better error correction. For purposes of LDPC code checking, interleaved data is restored back into the original data sequence by the de-interleavers 111, 112. Known interleaving/de-interleaving schemes include those employing: rectangular block type architectures arranging input data row-wise within a matrix and then obtaining interleaved data by reading the matrix column-wise (or vice versa); and convolutional architectures feeding the input data to a number of branches, each of which has a shift register with pre-defined length, then taking the output data from the branch outputs. Various standards have been defined for such interleaving/de-interleaving schemes by, for example, the Advanced Television Systems Committee (ATSC) and the Institute for Electrical and Electronic Engineers (IEEE).

The de-interleaved outputs of DLVs 111, 112 are passed to LDPC decoders 113, 114, which operate in accordance with the known art to decode the LDPC codes within the data sequence being processed by DBE 104. The output data sequences from LDPC decoders 113, 114 are interleaved by interleavers 115, 116 and buffered by decoder output buffers 117, 118, then transmitted from DBE 104 on outputs 119 and 120. In addition, Log-likelihood ratio (LLR) information from one detector-decoder combination is fed back on signal line 121 to the other detector-decoder combination so that highly reliable nodes whose LLR magnitude is large and does not significantly change from one update to the next may be identified, and that information employed by the second detector-decoder combination to schedule those nodes to update with lower frequency.

In the configuration illustrate in FIG. 1, the first detector-decoder combination is generally used for the first outer iteration—that is, for every 512 B codeword—while the second detector-decoder combination is employed for second/third outer iterations, and thus used only for those LDPC codes failing the first iteration. The LDPC decoders 113, 114, which are the largest components in the DBE 104, operate on a codeword size of 4864 bits or smaller in the example shown.

In designing a DBE for LDPC decoding that is compatible with both 512 B and 4 KB sectors, the goal is to maximally reuse resources without performance loss. A straightforward method would be to use a large LDPC code (4 KB or 1 KB long), which offers certain performance gain over 512 B sectors. However, this requires several additional large data buffers, and the 4 KB-sector LDPC decoders must be separate units from the 512 B-sector LDPC decoders.

FIG. 2 is a simplified diagram of the digital back end within a hard disk drive controller including an LDPC coded iterative system based on both size-512 B and size-4 KB sectors according to one embodiment of the present disclosure. Like numbers refer to like elements in FIGS. 1 and 2.

Instead of using a separate, large LDPC code for 4 KB sector size data as discussed above, the same LDPC code that is used for 512 B sector size data is also used for 4 KB sector size data. However, two or more codewords of 512 B sector size data are interlaced in the channel domain. Therefore the SOVA detector will operate on a longer block when 512 B sector size data is received, but the decoder will still work on 512 B codewords. In an exemplary embodiment, only two 512 B codewords are interlaced to form one 1 KB block, then four 1 KB blocks are concatenated to comprise one 4 KB sector. Known interlacing techniques successively and cyclically arranging the terms of a single data sequence in a plurality of padded data sequences may be employed.

With the solution of FIG. 2, the same SOVA/DDNP detectors 105 and 106, DLVs 111 and 112, LDPC decoders 113 and 114, and ILVs 115 and 116 are used for both the 512 KB sector size data and the 4 KB sector size data. The only additional hardware required is: de-interlacers (DLCs) 205 and 206 between the detector output buffers 109, 110 and the DLVs 111, 112; interlacers (ILCs) 115 and 116 between the ILVs 115, 116 and the output buffers 117, 118; and dual signal paths connecting units between the DLCs 205 and 206 and the ILCs 207 and 208. Both the DLCs 205 and 206 and the ILCs 207 and 208 contain very simple logic, and the additional signal paths are nominal.

Compared with 512 B sector size only systems, each LDPC decoder 113, 114 within the interlacer-based decoding system 204 of FIG. 2 is operating on bit sequences that have less inter-symbol interference, since each bit's immediate neighboring bits on the storage media 103 are located in other LDPC codewords. In addition, in the second/third outer decoding iteration, the LDPC decoder 114 is obtaining extrinsic information not only from the SOVA/DDNP detector 106, but also from the LDPC decoder 113 within the other detector-decoder combination. Thus performance is expected to improve from 512 B sector size systems without DLCs 205, 206 and ILCs 207, 208. In addition, several techniques described below can further improve the iterative decoding system.

FIG. 3 illustrates a technique for employing different interleavers in the digital back end of FIG. 2 according to one embodiment of the present disclosure. Performance enhancements in system diversity may be achieved using different interleavers 115, 116 within the two detector-decoder combinations. The fact that multiple LDPC decoders 113, 114 are running independently gives the system the opportunity to use code diversity. The equalized samples received by the DBE 204 will still suffer from inter-symbol interference, such that neighboring LLRs generated by the SOVA/DDNP detectors 105, 106 are likely to still be highly correlated. If the interlacing units (decoders 113 and 114, interleavers 115 and 116, etc.) are identical, the signals on outputs 119 and 120 are also likely to still be correlated (no diversity). In case of error, very little extrinsic information can be obtained among the decoders 113 and 114.

To improve the overall system performance, different interlacing units may be used in the DBE 204. Different interlacing can be achieved by either using different LDPC codes (an approach having disadvantages described above) or different interleavers. Since the interleavers in the current system are controlled solely by ILV seeds and are easy to change, different interleavers can be used on different codewords without ANY extra logic, simply by feeding the ILV seed for the current codeword into the DLVs 111 and 112 and ILVs 115 and 116 as shown in FIG. 3. Simulations on synthetic data, as well as drive tab data, demonstrate the exact gain of system diversity achieved by such diversity among codewords interleaved with different seeds.

In designing DBE 204, consideration should be given to a priori information saturation for the outer iterations. When using the interlacer-based iterative system, one new issue facing the outer iteration is how to use the LLRs when some codeword(s) in the same block are converged. When converged, natural early exit will allow the inner iterations to halt, thus disabling the update of LLRs for this codeword. However, in this case, if other codewords are not converged, the extrinsic information provided by the converged codeword is low and thus will not help other codewords enough.

One solution is to disable the natural exit and let the LLRs polarize until the end of maximum inner iteration. With that approach, system power consumption will increase since majority of the code will normally not need more than three inner iterations. To solve this issue, direct saturation of the extrinsic information may be used when a codeword is converged.

Although the above description is made in connection with specific exemplary embodiments, various changes and modifications will be apparent to and/or suggested by the present disclosure to those skilled in the art. It is intended that the present disclosure encompass all such changes and modifications as fall within the scope of the appended claims.

What is claimed is:

1. A low-density parity-check (LDPC) system selectively operating on data sequences of either a first size or of a second size greater than the first size, the system comprising:
   a detector configured to operate on blocks of bits of the second size, wherein data sequences of the first size are interlaced to form data sequences of the second size;
   an LDPC decoder configured to operate on blocks of bits of the second size; and
   a de-interlacer coupled between the detector and the LDPC decoder, the de-interlacer configured to convert a data sequence output by the detector into multiple data sequences prior to decoding by the LDPC decoder,
   wherein the LDPC decoder is configured to separately decode the multiple data sequences output by the de-interlacer, and
   wherein the LDPC system is configured to process data sequences stored in blocks of bits of either the first size or the second size with a single LDPC decoder configured to operate on blocks of bits of the second size.

2. The LDPC system of claim 1, further comprising:
   a de-interleaver coupled between the de-interlacer and the LDPC decoder, the de-interleaver configured to separately de-interleave each of the multiple data sequences output by the de-interlacer.

3. The LDPC system of claim 1, further comprising:
   an interleaver coupled to outputs the LDPC decoder, the interleaver configured to separately interleave each of the multiple data sequences output by the LDPC decoder; and
   an interlacer coupled to outputs of the interleaver, the interlacer configured to form a single data sequence from the multiple outputs of the interleaver.

4. The LDPC system of claim 1, wherein the interleaver and the de-interleaver each include an input for receiving an interleaving seed associated with LDPC codeword for a data sequence being processed, wherein different data sequences are processed using different interleaving seeds.

5. The LDPC system of claim 1, wherein interlaced data sequences are concatenated to form data sequences of the second size.

6. The LDPC system of claim 5, wherein the first size is 512 bytes and the second size is at least 1 kilobyte.

7. The LDPC system of claim 6, wherein the first size is 512 bytes and the second size is 4 kilobyte.

8. A method of low-density parity-check (LDPC) decoding of data sequences having either a first size or a second size greater than the first size, the method comprising:
   operating a detector on blocks of bits of the second size, wherein data sequences of the first size are interlaced to form data sequences of the second size;
   operating an LDPC decoder on blocks of bits of the second size; and
   converting a data sequence output by the detector into multiple data sequences prior to decoding by the LDPC decoder using a de-interlacer coupled between the detector and the LDPC decoder, wherein the LDPC decoder is configured to separately decode the multiple data sequences output by the de-interlacer, and
   wherein data sequences stored in blocks of bits of either the first size or the second size are processed with a single LDPC decoder configured to operate on blocks of bits of the second size.

9. The method of claim 8, further comprising:
   separately de-interleaving each of the multiple data sequences output by the de-interlacer using a de-interleaver coupled between the de-interlacer and the decoder.

10. The method of claim 8, further comprising:
    separately interleaving each of the multiple data sequences output by the LDPC decoder using an interleaver coupled to outputs the LDPC decoder; and
    forming a single data sequence from the multiple outputs of the interleaver using an interlacer coupled to outputs of the interleaver.

11. The method of claim 8, further comprising:
    providing an interleaving seed associated with LDPC codeword for a data sequence being processed to the interleaver and the deinterleaver, wherein different data sequences are processed using different interleaving seeds.

12. The method of claim 8, wherein interlaced data sequences are concatenated to form data sequences of the second size.

13. The method of claim 12, wherein the first size is 512 bytes and the second size is at least 1 kilobyte.

14. The method of claim 13, wherein the first size is 512 bytes and the second size is 4 kilobyte.

15. A low-density parity-check (LDPC) system selectively operating on data sequences of either a first size or of a second size greater than the first size, the system comprising:
    a first detector-decoder combination including
       a first detector configured to operate on blocks of bits of the second size, wherein data sequences of the first size are interlaced to form data sequences of the second size,
       a first LDPC decoder configured to operate on blocks of bits of the second size, and
       a first de-interlacer coupled between the first detector and the first LDPC decoder, the first de-interlacer configured to convert a data sequence output by the first detector into multiple data sequences prior to decoding by the first LDPC decoder, wherein the first LDPC decoder is configured to separately decode the multiple data sequences output by the first de-interlacer; and a second detector-decoder combination including
a second detector configured to operate on blocks of bits of the second size,
a second LDPC decoder configured to operate on blocks of bits of the second size, and
a second de-interlacer coupled between the second detector and the second LDPC decoder, the second de-interlacer configured to convert a data sequence output by the second detector into multiple data sequences prior to decoding by the second LDPC decoder,
wherein the second LDPC decoder is configured to separately decode the multiple data sequences output by the second de-interlacer, wherein the LDPC system is configured to process data sequences stored in blocks of bits of either the first size or the second size with first and second LDPC decoders configured to operate on blocks of bits of the second size.

16. The LDPC system of claim 15, further comprising:
a first de-interleaver coupled between the first de-interlacer and the first LDPC decoder, the first de-interleaver configured to separately de-interleave each of the multiple data sequences output by the de-interlacer; and
a second de-interleaver coupled between the second de-interlacer and the second LDPC decoder, the second de-interleaver configured to separately de-interleave each of the multiple data sequences output by the de-interlacer.

17. The LDPC system of claim 15, further comprising:
a first interleaver coupled to outputs the first LDPC decoder, the first interleaver configured to separately interleave each of the multiple data sequences output by the first LDPC decoder;
a first interlacer coupled to outputs of the first interleaver, the first interlacer configured to form a single data sequence from the multiple outputs of the first interleaver;
a second interleaver coupled to outputs the second LDPC decoder, the second interleaver configured to separately interleave each of the multiple data sequences output by the second LDPC decoder;
a second interlacer coupled to outputs of the second interleaver, the second interlacer configured to form a single data sequence from the multiple outputs of the second interleaver.

18. The LDPC system of claim 15, wherein the first and second interleavers and the first and second de-interleavers each include an input for receiving an interleaving seed associated with LDPC codeword for a data sequence being processed, wherein different data sequences are processed using different interleaving seeds.

19. The LDPC system of claim 15, wherein interlaced data sequences are concatenated to form data sequences of the second size.

20. The LDPC system of claim 19, wherein the first size is 512 bytes and the second size is 4 kilobyte.

* * * * *